United States Patent [19]

Satou et al.

[11] Patent Number: 5,605,648
[45] Date of Patent: Feb. 25, 1997

[54] PIEZOELECTRIC CERAMIC

[75] Inventors: Yasuyuki Satou, Niwa-gun; Hiroshi Matsuoka; Hiroyuki Satou, both of Anjo; Eturo Yasuda, Okazaki; Yasushi Sawada, Chita-gun, all of Japan

[73] Assignee: Nippon Soken Inc., Nishio, Japan

[21] Appl. No.: 578,277

[22] Filed: Dec. 26, 1995

[30] Foreign Application Priority Data

Dec. 28, 1994 [JP] Japan ..................................... 6-340599

[51] Int. Cl.⁶ .............................. C04B 35/49; H01L 41/00
[52] U.S. Cl. .............................. 252/62.9 PZ; 252/62.9 R; 501/136
[58] Field of Search ...................... 501/136; 252/62.9 R, 252/62.9 PZ; C04B 35/49

[56] References Cited

U.S. PATENT DOCUMENTS

| | | | |
|---|---|---|---|
| 3,372,121 | 3/1968 | Banno | 252/62.9 |
| 3,468,799 | 9/1969 | Kurihara et al. | 252/62.9 |
| 4,882,079 | 11/1989 | Tomita et al. | 252/62.9 |

FOREIGN PATENT DOCUMENTS

| | | | |
|---|---|---|---|
| 57-208183 | 12/1982 | Japan . | |
| 62-046961 | 2/1987 | Japan | C04B 35/49 |
| 63-152813 | 6/1988 | Japan | C04B 35/49 |
| 63-152812 | 6/1988 | Japan | C04B 35/49 |
| 4-038710 | 6/1992 | Japan . | |

*Primary Examiner*—Anthony Green
*Attorney, Agent, or Firm*—Cushman, Darby & Cushman IP Group of Pillsbury Madison & Sutro LLP

[57] ABSTRACT

A piezoelectric ceramic having a basic composition expressed by a ternary $PbTiO_3O_3$—$PbTiO_3$—$PbZrO_3$ solid solution, wherein part of the Pb is substituted by Sr, the $Pb(Y_{0.5}Nb_{0.5})O_3$ is present in an amount of more than 42 mol % of the ternary solid solution, and the ceramic contains $Mn_2O_3$ in an amount of 0.01 wt % or more and less than 0.5 wt %. The piezoelectric ceramic provides a material for a piezoelectric device which operates without substantially varying in output, and thereby mitigates the load on the drive circuit, under a large temperature variation.

13 Claims, 1 Drawing Sheet

PIEZOELECTRIC CERAMIC

BACKGROUND OF THE INVENTION

1. Field of the Invention

The present invention relates to a piezoelectric ceramic suitable as a material for actuators.

2. Description of the Related Art

The piezoelectric ceramics having a basic composition expressed by a ternary $Pb(Y_{0.5}Nb_{0.5})O_3$—$PbTiO_3$—$PbZrO_3$ solid solution in which part of the Pb is substituted by Ba, Sr, etc., provide good response and are utilized as piezoelectric elements in various actuators. The ternary solid solution has proportions of the three components and an amount of the substituted Pb suitable to provide the desired piezoelectric characteristics.

Japanese Unexamined Patent Publication (Kokai) No. 57-208183 discloses a piezoelectric ceramic having a composition modified from the basic composition by adding trace amounts of a metal oxide additive, such as MgO, $Sb_2O_3$, etc., to provide improved mechanical properties.

U.S. Pat. No. 4,882,079 discloses another piezoelectric ceramic having a composition modified from the basic composition by adding trace amounts of a metal oxide additive such as $Nb_2O_5$, $WO_3$, $La_2O_3$, etc., to provide improved piezoelectric characteristics.

The above-recited conventional piezoelectric ceramics have a problem in that, when they are used as actuator elements in automobile equipment and subjected to large temperature variations, the dielectric constants of the ceramic vary as the temperature varies, causing both the current supply to a drive circuit and the rise time of the applied voltage pulse to vary with the temperature. The drive circuit must be controlled to cope with this problem.

It is therefore desired that the temperature-caused (or temperature induced) change in the dielectric constant be reduced to mitigate the load on the drive circuit.

SUMMARY OF THE INVENTION

The object of the present invention is to provide a piezoelectric ceramic having a basic composition expressed by a ternary $Pb(Y_{0.5}Nb_{0.5})O_3$—$PbTiO_3$—$PbZrO_3$ solid solution and providing a reduced temperature-caused change in the dielectric constant.

To achieve the object according to the first aspect of the present invention, there is provided a piezoelectric ceramic having a basic composition expressed by a ternary $Pb(Y_{0.5}Nb_{0.5})O_3$—$PbTiO_3$—$PbZrO_3$ solid solution, wherein part of the Pb is substituted by Sr, the $PbTiO_3$ component is present in an amount of more than 42 mol % of the ternary solid solution, and the ceramic contains $Mn_2O_3$ in an amount of 0.01 wt % or more and less than 0.5 wt %.

There is also provided, according to the second aspect of the present invention, a piezoelectric ceramic having a basic composition expressed by a ternary $PbTiO_3$ component —$PbTiO_3$—$PbZrO_3$ solid solution, wherein the Pb is partially substituted by Sr, the $Pb(Y_{0.5}Nb_{0.5})O_3$ is present in an amount of more than 42 mol % of the ternary solid solution, and the ceramic contains $Nb_2O_5$ in an amount of less than 2 wt % and $Mn_2O_3$ in an amount of 0.01 wt % or more and less than 0.5 wt %.

The present invention reduces the temperature-caused change in the electrostatic capacity by adding a trace amount of $Mn_2O_3$ to a basic composition expressed by a ternary $Pb(Y_{0.5}Nb_{0.5})O_3$—$PbTiO_3$—$PbZrO_3$ solid solution in which part of the Pb is substituted by Sr. The $Mn_2O_3$ content of the ceramic must be 0.01 wt % or more and less than 0.5 wt %. $Mn_2O_3$ must be present in an amount of 0.01 wt % or more to ensure the reduction of the temperature-caused change in the electrostatic capacity. The temperature-caused change in the electrostatic capacity becomes smaller as the $Mn_2O_3$ content is increased. The $Mn_2O_3$ content, however, must be less than 0.5 wt % because the temperature-caused change in the electrostatic capacity is increased again if the $Mn_2O_3$ content is 0.5 wt % or more.

The basic composition of the present invention is a ternary solid solution defined by the formula:

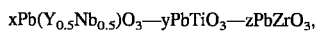

$$xPb(Y_{0.5}Nb_{0.5})O_3\text{—}yPbTiO_3\text{—}zPbZrO_3,$$

in which the proportions of the three components, i.e., the values of x, y, and z, are adjusted in accordance with desired piezoelectric and mechanical properties. The y-value, i.e., the amount of $PbTiO_3$, must be more than 42 mol % to ensure the effectiveness of the addition of $Mn_2O_3$. To minimize the temperature-caused change in the electrostatic capacity, the ternary solid solution is preferably composed of $Pb(Y_{0.5}Nb_{0.5})O_3$ in an amount of 0.5 mol % or more and 3 mol % or less (i.e., $0.5 \leq x \leq 3$ mol %), $PbTiO_3$ in an amount of more than 42 mol % and less than 50 mol % (i.e., $42 < y < 50$ mol %), and $PbZrO_3$ in an amount of more than 47 mol % and 57.5 mol % or less (i.e., $47 < z \leq 57$ mol %). More preferably, $Pb(Y_{0.5}Nb_{0.5})O_3$ is present in an amount of 0.5 mol % or more and less than 3 mol % (i.e., $0.5 \leq x < 3$ mol %). The preferred composition also provides improved piezoelectric properties such as the piezoelectric constant.

In the ternary solid solution, the Pb amount substituted by Sr is not necessarily limited. The substituted Pb amount is preferably 15 mol % or less, because the Curie temperature sharply drops when more than 15 mol % of Pb is substituted by Sr. On the other hand, when the Pb amount substituted by Sr is less than 5 mol %, the Curie temperature is too high to provide good piezoelectric properties.

According to the second aspect of the present invention, $Nb_2O_5$ is present to provide an increased displacement in a piezoelectric device and an increased mechanical strength. The $Nb_2O_5$ content must be less than 2 wt % to ensure good piezoelectric properties. The $Nb_2O_5$ content is preferably 1 wt % or less.

The piezoelectric ceramic of the present invention is produced by a conventional powder metallurgy process. The starting powder materials are weighed, mixed, and pre-fired to provide a desired chemical composition of the final product ceramic. The pre-fired material is then ground and granulated to form a powder, which is then compacted and fired. The preferred starting powder materials are provided in the form of a metal oxide such as PbO, $Y_2O_3$, $TiO_2$, $ZrO_2$, $Nb_2O_5$, $Mn_2O_3$, etc.

The present invention is based on a finding that a piezoelectric ceramic having a basic composition expressed by a ternary $Pb(Y_{0.5}Nb_{0.5})O_3$—$PbTiO_3$—$PbZrO_3$ solid solution, when containing a specific amount of $Mn_2O_3$, exhibits a reduced temperature-caused change in the electrostatic capacity, although the reason for the reduction has not been clarified. The ceramic according to the present invention is advantageously used to produce a piezoelectric device exhibiting a reduced output change and improved reliability even under a large temperature change.

DESCRIPTION OF THE PREFERRED EMBODIMENTS

EXAMPLE 1: SAMPLES 1–4 & COMPARATIVE SAMPLES C1–C6

Figure 1:
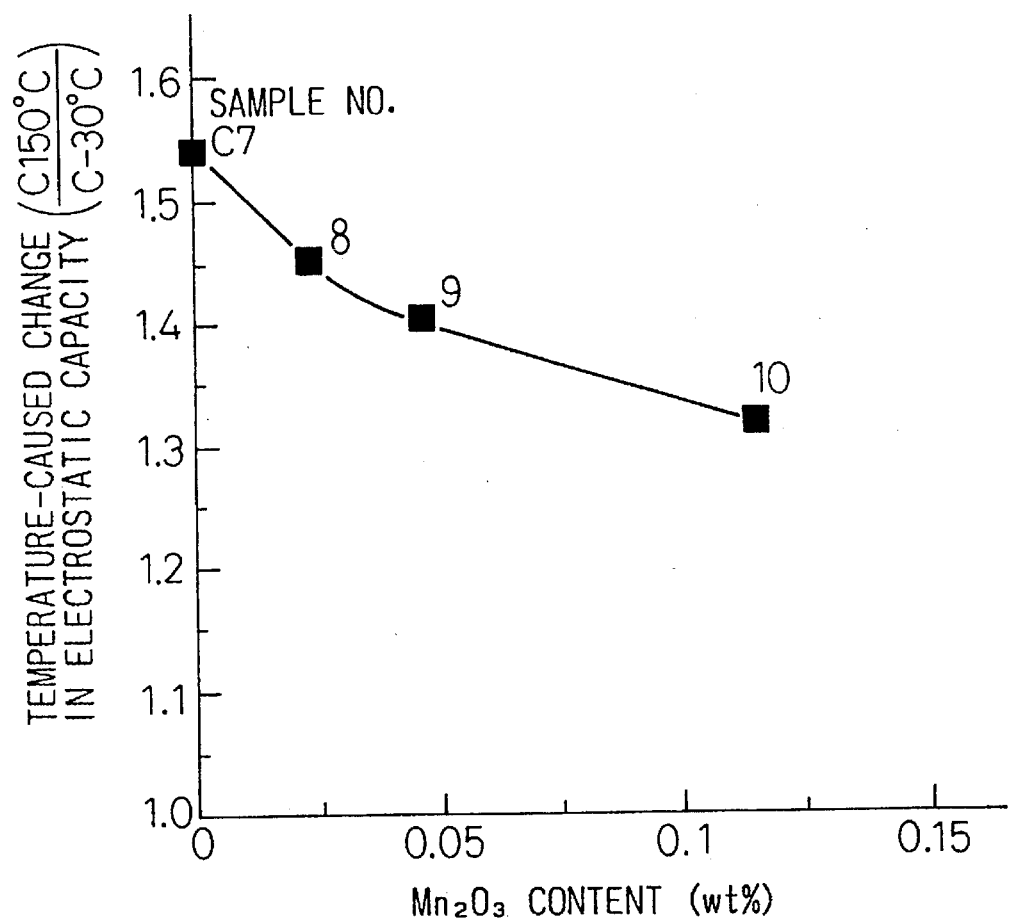
FIG. 1 is a graph showing the temperature-caused change in the electrostatic capacity as a function of the $Mn_2O_3$ content.

Piezoelectric ceramic samples having a basic composition expressed by a ternary $xPb(Y_{0.5}Nb_{0.5})O_3$—$yPbTiO_3$—$zPbZrO_3$ solid solution (x, y, z in mol %) in which part of the Pb is substituted by Sr and containing $Mn_2O_3$ in an amount of W wt % shown in Table 1 were produced by the following process. The produced samples have the compositions shown in Table 1, in which the values of x, y and z and the substituted Pb amount are varied and each variation has the $Mn_2O_3$ contents of 0 wt % for the comparative samples C1–C5 and 0.1 wt % for the inventive samples and comparative example C6.

To provide the shown compositions, the starting powder materials of PbO, $TiO_2$, $Y_2O_3$, $ZrO_2$, $Nb_2O_5$, and $Mn_2O_3$ were weighed and mixed in a wet type ball mill. The mixture was pre-fired at 700° to 1050° C. for 3 to 10 hours. The pre-fired materials were then ground and milled in a ball mill, and after adding water, polyvinyl alcohol or other adhesive agents, the materials were further milled and granulated in a spray dryer or the like. The granulated powders were compacted under a pressure of from 300 to 1000 $kgf/cm^2$ and the compacts were fired at 1050° to 1300° C. for 0.5 to 4 hours to provide fired products.

The fired products were press-formed to a disc having a diameter of 17 mm and a thickness of 0.5 mm, on both sides of which electrodes of silver or other conductive materials were then formed by a conventional method. The discs were polarized by application of a voltage of 20 to 30 kV/cm for 0.1 to 2 hours at 20 to 150° C. After 24 hours were elapsed, the discs were subjected to measurement of the properties. The electrostatic capacity was measured at a frequency of 1 kHz and an amplitude of 1 V by an impedance analyzer. The temperature-caused change in the electrostatic capacity is determined as a ratio of the value measured at 150° C. to the value measured at −30° C. The dielectric constant $d_{31}$ and the electromechanical coupling factor were measured and determined by a resonance/anti-resonance method.

Table 1 demonstrates that the samples containing $Mn_2O_3$ exhibited a reduction in the temperature-caused change in the electrostatic capacity with respect to the samples not containing $Mn_2O_3$ under the various values of x, y, and z and the various substituted Pb content. The effect of the addition of $Mn_2O_3$, however, is not observed when the y value is 42 mol % as can be seen from Comparative Samples C5 and C6, and therefore, the y value must be more than 42 mol % of the ternary solid solution.

EXAMPLE 2: SAMPLES 8–10 & COMPARATIVE SAMPLE C7

Piezoelectric ceramic samples having a basic composition expressed by a ternary $Pb(Y_{0.5}Nb_{0.5})O_3$-45.5 $PbTiO_3$-53.5 $PbZrO_3$ solid solution (in mol %) in which 9 mol % Pb is substituted by Sr and containing $Mn_2O_3$ in an amount of W wt % shown in Table 2 were produced by the process similar to that used in Example 1. The properties of the produced ceramic discs were measured in the same manner as in Example 1 and the measured data are summarized in Table 2.

The data of the temperature-caused change in the electrostatic capacity in Table 2 are also plotted in FIG. 1 as a function of the $Mn_2O_3$ content. FIG. 1 shows that the temperature-caused change in the electrostatic capacity is reduced as the $Mn_2O_3$ content is increased.

EXAMPLE 3: SAMPLES 11–13 & COMPARATIVE SAMPLES 8–11

Piezoelectric ceramic samples having a basic composition expressed by a ternary $Pb(Y_{0.5}Nb_{0.5})O_3$-45.5 $PbTiO_3$-53.5 $PbZrO_3$ solid solution (in mol %) in which 9 mol % Pb is substituted by Sr and containing $Mn_2O_3$ in an amount of W wt % and $Nb_2O_5$ in an amount of U wt % shown in Table 3 were produced by the process similar to that used in Example 1. The properties of the produced ceramic discs were measured in the same manner as in Example 1 and the measured data are summarized in Table 3.

Table 3 also shows that the temperature-caused change in the electrostatic capacity is reduced as the $Mn_2O_3$ content is increased under the presence of the added $Nb_2O_5$. It should be noted, however, that the temperature-caused change in the electrostatic capacity is increased in Comparative Sample 11 in which the $Mn_2O_3$ content is increased to 0.5 wt %.

It is concluded from Tables 2 and 3 that the $Mn_2O_3$ content must be 0.01 wt % or more and less than 0.5 wt %.

As herein described above, the present invention provides a piezoelectric ceramic based on a ternary $Pb(Y_{0.5}Nb_{0.5})O_3$—$PbTiO_3$—$PbZrO_3$ with part of the Pb substituted by Sr, in which the temperature-caused change in the electrostatic capacity is reduced by the addition of $Mn_2O_3$. The temperature-caused change in the electrostatic capacity is further reduced when the amounts of the three components of the ternary solid solution and the substituted Pb amount are limited in the specified ranges.

The piezoelectric ceramic of the present invention is advantageous in industry because it provides a material for a piezoelectric device which operates without substantially varying in output and thereby mitigating the load on the drive circuit, under a large temperature variation.

TABLE 1

| Sample No. | Composition | | | | | Fired density | Electrostatic capacity at room temperature (nF) | Temperature-caused change in electrostatic capacity (C150° C./C-30° C.) | Dielectric constant d31 × $10^{-12}$m/V | Kp |
| --- | --- | --- | --- | --- | --- | --- | --- | --- | --- | --- |
|  | x | y | z | Pb substituted by Sr | W |  |  |  |  |  |
| C1 | 1 | 48 | 51 | 9 | 0 | 7.58 | 2.46 | 2.92 | 103 | 0.54 |
| 1 | 1 | 48 | 51 | 9 | 0.1 | 7.56 | 7.28 | 1.64 | 185 | 0.57 |
| C2 | 1 | 45.5 | 53.5 | 11.5 | 0 | 7.51 | 7.92 | 1.60 | 189 | 0.54 |
| 2 | 1 | 45.5 | 53.5 | 11.5 | 0.1 | 7.51 | 8.09 | 1.47 | 214 | 0.60 |
| C3 | 1 | 45.5 | 53.5 | 5 | 0 | 7.62 | 4.43 | 3.49 | 168 | 0.62 |
| 3 | 1 | 45.5 | 53.5 | 5 | 0.1 | 7.50 | 8.13 | 1.60 | 221 | 0.61 |
| C4 | 3 | 44 | 53 | 9 | 0 | 7.52 | 8.76 | 2.63 | 266 | 0.65 |
| 4 | 3 | 44 | 53 | 9 | 0.1 | 7.56 | 2.20 | 2.56 | 87 | 0.50 |
| C5 | 1 | 42 | 57 | 9 | 0 | 7.52 | 5.15 | 1.92 | 123 | 0.47 |
| C6 | 1 | 42 | 57 | 9 | 0.1 | 7.56 | 2.22 | 2.64 | 88 | 0.51 |

(Note) Samples 1–4: Inventive Samples
Samples C1–C6: Comparative Samples

| Sample No. | Composition | | | | | Fired density | Electrostatic capacity at room temperature (nF) | Temperature-caused change in electrostatic capacity (C150° C./C-30° C.) | Dielectric constant d31 × $10^{-12}$m/V | Kp |
| --- | --- | --- | --- | --- | --- | --- | --- | --- | --- | --- |
|  | x | y | z | Pb substituted by Sr | W |  |  |  |  |  |
| c7 | 1 | 45.5 | 53.5 | 9 | 0 | 7.58 | 7.85 | 1.54 | 164 | 0.47 |
| 8 | 1 | 45.5 | 53.5 | 9 | 0.025 | 7.48 | 7.83 | 1.45 | 256 | 0.63 |
| 9 | 1 | 45.5 | 53.5 | 9 | 0.05 | 7.56 | 7.81 | 1.40 | 212 | 0.58 |
| 10 | 1 | 45.5 | 53.5 | 9 | 0.12 | 7.50 | 6.69 | 1.31 | 192 | 0.57 |

(Note) Samples 8–10: Inventive Samples
Samples C7: Comparative Samples

TABLE 3

| Sample No. | Composition | | | | | | Fired density | Electrostatic capacity at room temperature (nF) | Temperature-caused change in electrostatic capacity (C150° C./C-30° C.) | Dielectric constant d31 × $10^{-12}$m/V | Kp |
| --- | --- | --- | --- | --- | --- | --- | --- | --- | --- | --- | --- |
|  | x | y | z | Pb substituted by Sr | W | U |  |  |  |  |  |
| C8 | 1 | 45.5 | 53.5 | 9 | 0 | 1 | 7.55 | 9.20 | 2.05 | 286 | 0.68 |
| 11 | 1 | 45.5 | 53.5 | 9 | 0.1 | 1 | 7.50 | 4.49 | 1.50 | 100 | 0.43 |
| C9 | 1 | 45.5 | 53.5 | 9 | 0 | 0.3 | 7.50 | 9.14 | 1.78 | 308 | 0.71 |
| 12 | 1 | 45.5 | 53.5 | 9 | 0.1 | 0.3 | 7.48 | 7.33 | 1.41 | 170 | 0.53 |
| C10 | 1 | 45.5 | 53.5 | 9 | 0 | 0.5 | 7.55 | 9.20 | 2.04 | 77 | 0.62 |
| 13 | 1 | 45.5 | 53.5 | 9 | 0.25 | 0.5 | 7.45 | 7.73 | 1.46 | 213 | 0.60 |
| C11 | 3 | 45.5 | 53.5 | 9 | 0.5 | 0.5 | 7.55 | 5.84 | 2.13 | 188 | 0.60 |

(Note) Samples 11–13: Inventive Samples
Samples C8–C11: Comparative Samples

We claim:

1. A piezoelectric ceramic having a basic composition expressed as a ternary $Pb(Y_{0.5}Nb_{0.5})O_3$—$PbTiO_3$—$PbZrO_3$ solid solution, wherein a portion of the Pb is substituted by Sr, wherein the $PbTiO_3$ is present in an amount of more than 42 mol % of the ternary solid solution, and wherein the ceramic contains $Mn_2O_3$ in an amount in a range from at least 0.01 wt % to less than 0.5 wt %.

2. A piezoelectric ceramic according to claim 1, wherein the $Pb(Y_{0.5}Nb_{0.5})O_3$ is present in an amount in a range from 0.5 mol % to 3 mol % of the ternary solid solution, wherein the $PbTiO_3$ is present in an amount in a range from more than 42 mol % to less than 50 mol % of the ternary solid solution, and wherein the $PbZrO_3$ is present in an amount in a range between 47 mol % and 57.5 mol % of the ternary solid solution.

3. A piezoelectric ceramic according to claim 1, wherein the portion of the Pb substituted by the Sr is in a range from more than 5 mol % to at most 15 mol % of the ternary solid solution.

4. A piezoelectric ceramic according to claim 2, wherein the portion of the Pb substituted by the Sr is in a range from more than 5 mol % to at most 15 mol % of the ternary solid solution.

5. A piezoelectric ceramic according to claim 1, wherein the $Pb(Y_{0.5}Nb_{0.5})O_3$ is present in an amount in a range from at least 0.5 mol % to less than 3 mol %.

6. A piezoelectric ceramic according to claim 1, wherein the ceramic contains is free of any metal oxide additives other than $Mn_2O_3$.

7. A piezoelectric ceramic having a basic composition expressed as a ternary $Pb(Y_{0.5}Nb_{0.5})O_3$—$PbTiO_3$—$PbZrO_3$ solid solution, wherein a portion of the Pb is substituted by Sr, wherein the $PbTiO_3$ is present in an amount of more than 42 mol % of the ternary solid solution, and wherein the ceramic contains $Nb_2O_5$ in an amount of less than 2 wt % and $Mn_2O_3$ in an amount in a range from at least 0.01 wt % to less than 0.5 wt %.

8. A piezoelectric ceramic according to claim 7, wherein the $Pb(Y_{0.5}Nb_{0.5})O_3$ is present in an amount in a range from 0.5 mol % to 3 mol % of the ternary solid solution, wherein the $PbTiO_3$ is present in an amount in a range from more than 42 mol % to less than 50 mol % of the ternary solid solution, and wherein the $PbZrO_3$ is present in an amount in a range between 47 mol % and 57.5 mol % of the ternary solid solution.

9. A piezoelectric ceramic according to claim 7, wherein the portion of the Pb substituted by the Sr is in a range from more than 5 mol % to at most 15 mol % of the ternary solid solution.

10. A piezoelectric ceramic according to claim 8, wherein the portion of the Pb substituted by the Sr is in a range from more than 5 mol % to at most 15 mol % of the ternary solid solution.

11. A piezoelectric ceramic according to claim 7, wherein the $Nb_2O_5$ is present in an amount not greater than 1 wt % of the ceramic.

12. A piezoelectric ceramic according to claim 8, wherein the $Nb_2O_5$ is present in an amount not greater than 1 wt % of the ceramic.

13. A piezoelectric ceramic according to claim 7, wherein the $Pb(Y_{0.5}Nb_{0.5})O_3$ is present in an amount in a range from at least 0.5 mol % to less than 3 mol %.

* * * * *